United States Patent
Zhang et al.

(10) Patent No.: US 10,025,125 B2
(45) Date of Patent: Jul. 17, 2018

(54) DISPLAY PANEL AND DISPLAY APPARATUS

(71) Applicant: BOE Technology Group Co., Ltd., Beijing (CN)

(72) Inventors: Yu Zhang, Beijing (CN); Qian Jia, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 12 days.

(21) Appl. No.: 15/207,556

(22) Filed: Jul. 12, 2016

(65) Prior Publication Data

US 2017/0192287 A1   Jul. 6, 2017

(30) Foreign Application Priority Data

Jan. 4, 2016   (CN) .......................... 2016 1 0004073

(51) Int. Cl.
| | |
|---|---|
| *G02F 1/1333* | (2006.01) |
| *G02F 1/1339* | (2006.01) |
| *G02F 1/1335* | (2006.01) |
| *H01L 27/12* | (2006.01) |
| *H01L 29/49* | (2006.01) |

(52) U.S. Cl.
CPC .... *G02F 1/133305* (2013.01); *G02F 1/13394* (2013.01); *G02F 1/133514* (2013.01); *H01L 27/1214* (2013.01); *H01L 29/4908* (2013.01); *G02F 2001/13398* (2013.01); *G02F 2201/50* (2013.01)

(58) Field of Classification Search
CPC ...................... G02F 1/133305; G02F 1/133514

USPC .......................................................... 349/156
See application file for complete search history.

(56) References Cited

U.S. PATENT DOCUMENTS

| | | |
|---|---|---|
| 8,072,553 B2 | 12/2011 | Chang |
| 9,411,183 B2 | 8/2016 | Zuo et al. |
| 2006/0273716 A1 | 12/2006 | Uhlig et al. |

(Continued)

FOREIGN PATENT DOCUMENTS

| | | |
|---|---|---|
| CN | 101995693 A | 3/2011 |
| CN | 102116936 A | 7/2011 |

(Continued)

OTHER PUBLICATIONS

First Office Action, including Search Report, for Chinese Patent Application No. 201610004073.7, dated Mar. 23, 2018, 10 pages.

*Primary Examiner* — Christopher Raabe
(74) *Attorney, Agent, or Firm* — Westman, Champlin & Koehler, P.A.

(57) ABSTRACT

This disclosure pertains to the technical field of liquid crystal display, and in particular to a display panel and a display apparatus. This display panel comprises a first substrate and a second substrate provided by cell-assembling, wherein the first substrate and the second substrate are both flexible and bendable, and wherein both of the first substrate and the second substrate are provided with a repulsion layer therein, which enables the first substrate and the second substrate to repel each other. By the addition of the repulsion layer to the display panel, the effect of maintaining a uniform cell thickness of the flexible display panel is achieved and the display panel is allowed to have a better displaying effect.

18 Claims, 4 Drawing Sheets

(56) References Cited

U.S. PATENT DOCUMENTS

| | | | | |
|---|---|---|---|---|
| 2008/0128683 A1* | 6/2008 | Kim | .................... | H01L 51/5246 257/40 |
| 2008/0246398 A1* | 10/2008 | Shida | ....................... | H01J 11/12 313/582 |
| 2008/0303779 A1* | 12/2008 | MacHida | ............. | G09G 3/3446 345/107 |
| 2011/0043714 A1 | 2/2011 | Chang | | |
| 2011/0157338 A1* | 6/2011 | Chang | ................ | G02B 27/2214 348/59 |
| 2011/0179640 A1* | 7/2011 | Arnold | .................... | H01L 24/95 29/825 |
| 2014/0176883 A1 | 6/2014 | Zuo et al. | | |
| 2015/0048148 A1* | 2/2015 | Morris | .................... | H01L 24/95 228/180.1 |
| 2016/0179200 A1* | 6/2016 | Billington | ............... | G06F 3/016 345/173 |

FOREIGN PATENT DOCUMENTS

| | | | |
|---|---|---|---|
| CN | 102654671 | | 9/2012 |
| JP | H11202350 A | | 7/1999 |
| KR | 20080074368 A | * | 8/2008 |

* cited by examiner

DISPLAY PANEL AND DISPLAY APPARATUS

FIELD OF THE INVENTION

This disclosure pertains to the technical field of liquid crystal display, and in particular to a display panel and a display apparatus.

BACKGROUND OF THE INVENTION

With the development of display technology, the pursuit for the quality of display apparatuses is higher and higher, and fashioned devices such as wearable device or the like, are also more and more sought for. Particularly, as Apple Watch products become on the market and best-selling, a large market for flexible display apparatuses has been more exhibited.

A flexible display apparatus, as its name implies, has a display panel significantly different from a conventional rigid glass panel, and its key feature is that the display panel has the flexibility and exhibits a bendable property. At present, flexible liquid crystal displays (simply referred to as LCDs) are the most common investigational products, of which the color filter substrate and the array substrate for holding liquid crystal are all formed of soft and bendable flexible substrates to ensure the flexibility and the bendability of display panels. As shown in FIG. 1, a liquid crystal cell thickness formed of both a color filter substrate 1 and an array substrate (not shown in FIG. 1) is held by the support of the spacer 3.

However, since its display panel is soft, it is caused to be too soft where the spacer 3 supports a force, such that the cell thickness is uneven. It is a bottleneck for flexible liquid crystal display panels to maintain the uniformity of the cell thickness. As shown in FIG. 2, in the prior art, a uniform cell thickness is typically maintained by increasing the density of the spacer 3. However, the increase in the density of the spacer 3 is limited, and other additional problems may be further brought about, for example, the increase in the possibility of rubbing mura defect due to excessively high density of the spacer 3; and since the contact area between the spacer 3 and the substrate correspondingly increases due to excessively high density of the spacer 3, when the upper and the lower substrates displace and slide (for example, as a shown in FIG. 2), defects such as light leakage in dark state or the like, may be caused because the original position could not be recovered to in time due to the increase of friction. All of the above problems severely affect the displaying effect of display apparatuses.

As can be seen, it is a technical problem, which is urgent to be solved at present, to design a display panel which has a simple structure and is capable of better maintaining a uniform cell thickness.

SUMMARY OF THE INVENTION

A technical problem to be solved in this disclosure is to provide a display panel and a display apparatus, with respect to the above shortages present in the prior art. By the addition of the repulsion layer to the display panel, the effect of maintaining a uniform cell thickness of the flexible display panel is achieved and the display panel is allowed to have a better displaying effect.

A technical solution used for solving the technical problem in this disclosure is that this display panel comprises a first substrate and a second substrate provided by cell-assembling, wherein the first substrate and the second substrate are both flexible and bendable, and wherein both of the first substrate and the second substrate are provided with a repulsion layer therein, which enables the first substrate and the second substrate to repel each other.

Preferably, the repulsion layer comprises magnetic particles with the same polarity, and the magnetic particles are formed by doping a magnetic transition metal with a nonmagnetic transition metal.

Preferably, the doping ratio of the magnetic transition metal to the nonmagnetic transition metal is in a range of 90-60:10-40, more preferably 80-60:20-40, and most preferably 70-65:30-35.

Preferably, the magnetic transition metal comprises Fe, Co or Mn, and the nonmagnetic transition metal comprises Zn or Ti.

Preferably, the magnetic particles are uniformly distributed in the repulsion layer, and the repulsion layer has a thickness in a range of 500 Å-2000 Å, more preferably 700 Å-1500 Å, and most preferably 800 Å-1000 Å.

Preferably, the repulsion layer is formed by a patterning process, and a repulsion film layer preliminarily doped with the magnetic particles is formed by deposition in a film-forming process in the patterning process.

Preferably, the first substrate and the second substrate are correspondingly divided into a plurality of pixel regions, and spacing regions are formed between the areas of the adjacent pixel regions, and the repulsion layers are at least distributed in the spacing regions of the first substrate and the second substrate.

Preferably, the repulsion layer further extends to the pixel regions of the first substrate and the second substrate.

Preferably, the first substrate is a color filter substrate, the second substrate is an array substrate, and at least a part of the spacing regions of the color filter substrate are further provided with a spacer.

Further preferably, the array substrate comprises a gate electrode insulating layer, and magnetic particles are provided in the gate electrode insulating layer to form the repulsion layer;

and/or, the color filter substrate comprises color photoresists and a black matrix provided between the adjacent color photoresists, and magnetic particles are provided in the black matrix to form the repulsion layer.

This disclosure provides a display apparatus comprising the display panel described above.

This disclosure has the advantageous effect that in this display panel, with respect to the cell thickness of the flexible display panel, repulsion layers are provided in both of a first substrate and a second substrate which are cell-assembled at the top and at the bottom, and one substrate provides an opposite action force to the other by the magnetically repulsive force between both of them to maintain a uniform distance range between the first substrate and the second substrate. This effectively solves the drawback that the flexible display panel is excessively soft, and the effect of effectively maintaining the liquid crystal cell thickness of the flexible display panel has been achieved.

Accordingly, the display apparatus using this display panel has a better displaying effect.

DETAILED DESCRIPTION OF THE INVENTION

In order to allow the person skilled in the art to better understand the technical solution of this disclosure, the display panel and the display apparatus in this disclosure will be further described in detail in conjunction with the accompanying drawings and specific embodiments.

Example 1

This Example provides a display panel, which has a uniform liquid crystal cell thickness so as to have a better displaying effect.

A display panel comprises a first substrate and a second substrate which are provided by cell-assembling, wherein the first substrate and the second substrate are both flexible and bendable, and wherein repulsion layers are provided in both of the first substrate and the second substrate, and the repulsion layers enable the first substrate and the second substrate to repel each other.

Figure 1:
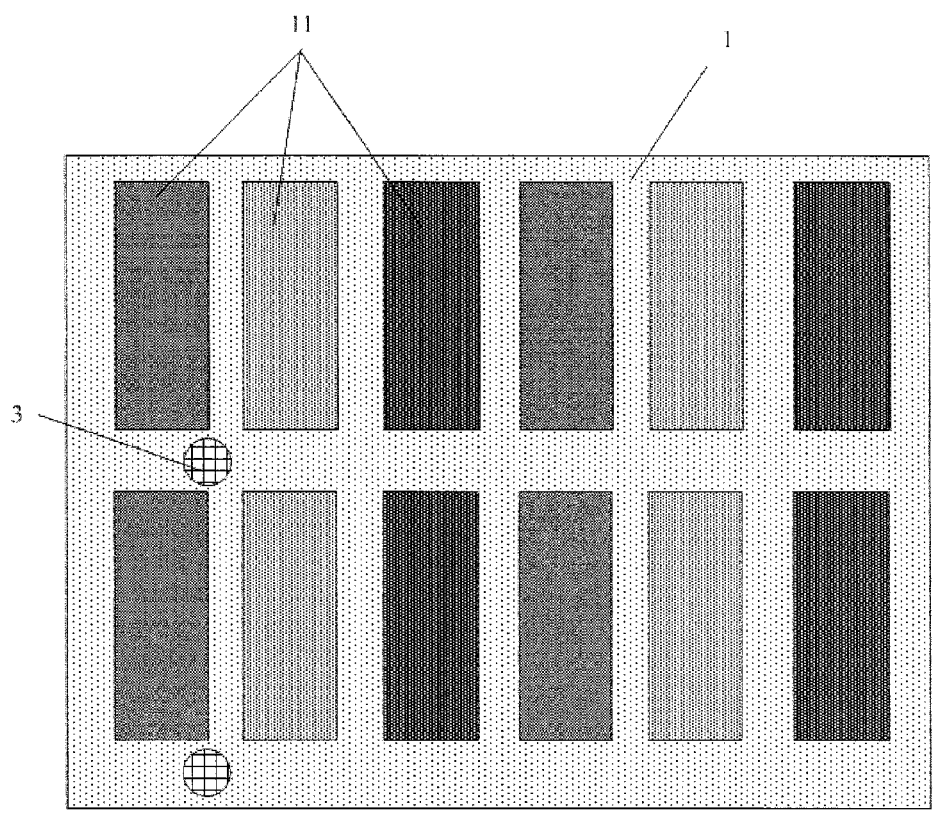
FIG. 1 is a top view of a display panel in the prior art.
Figure 2:
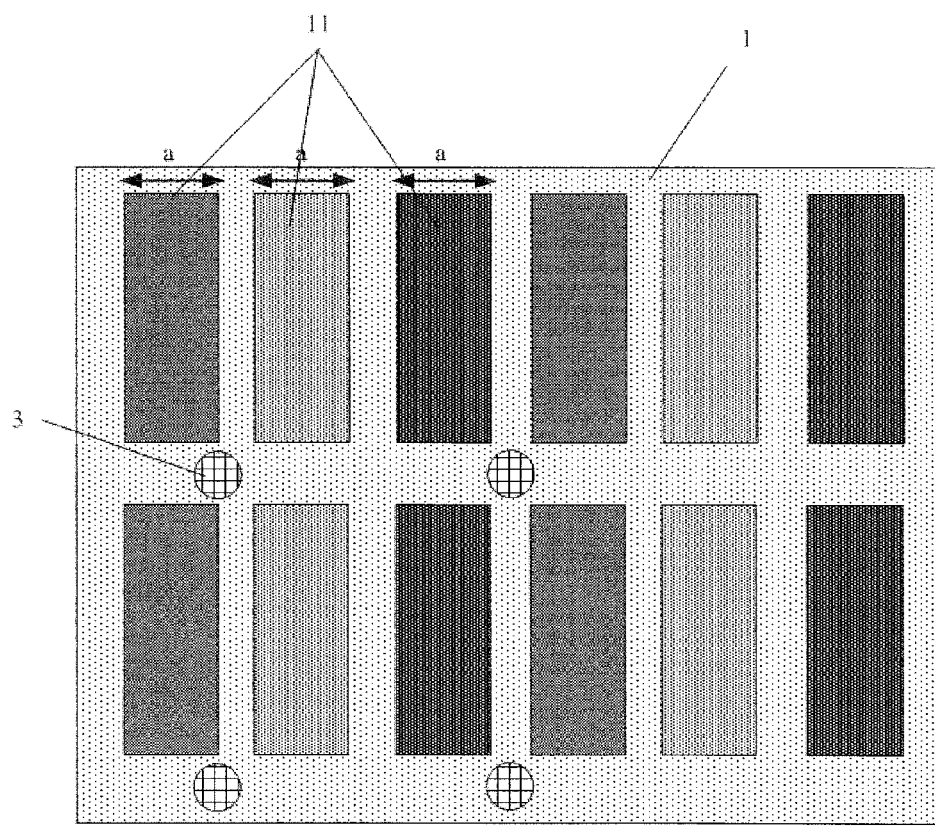
FIG. 2 is a top view of a display panel in the prior art wherein the density of a spacer is increased.
Figure 3:
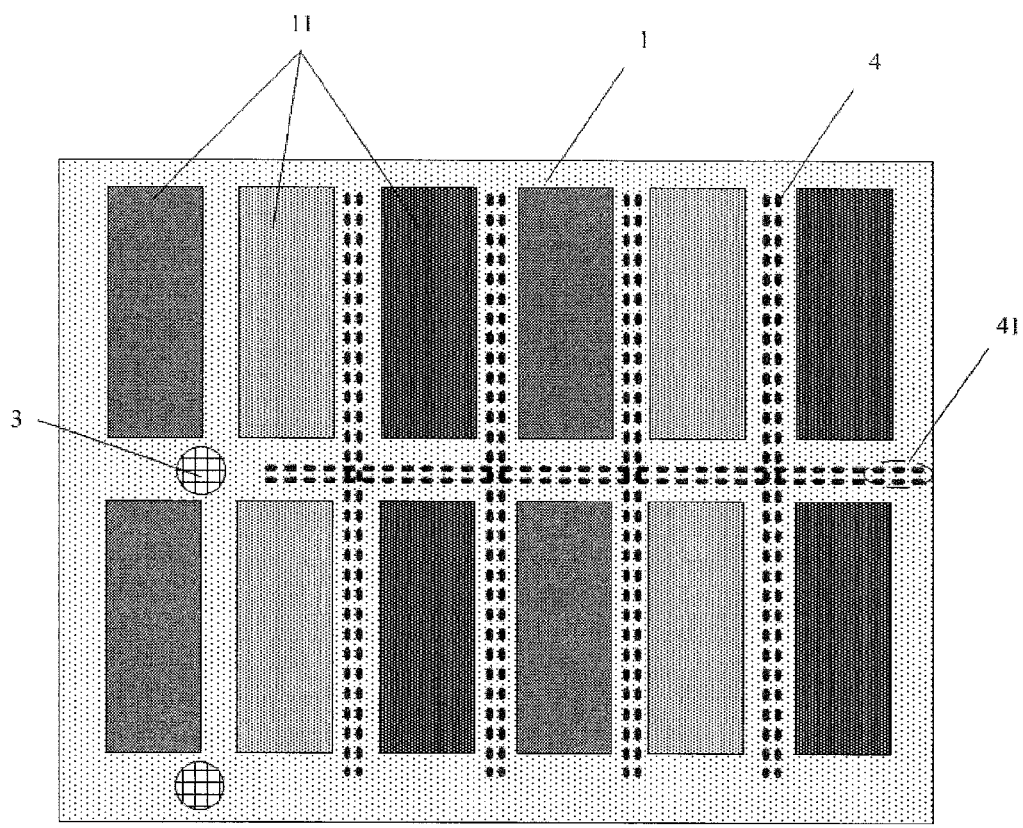
FIG. 3 is a top view of the display panel in Example 1 of this disclosure.
Figure 4:
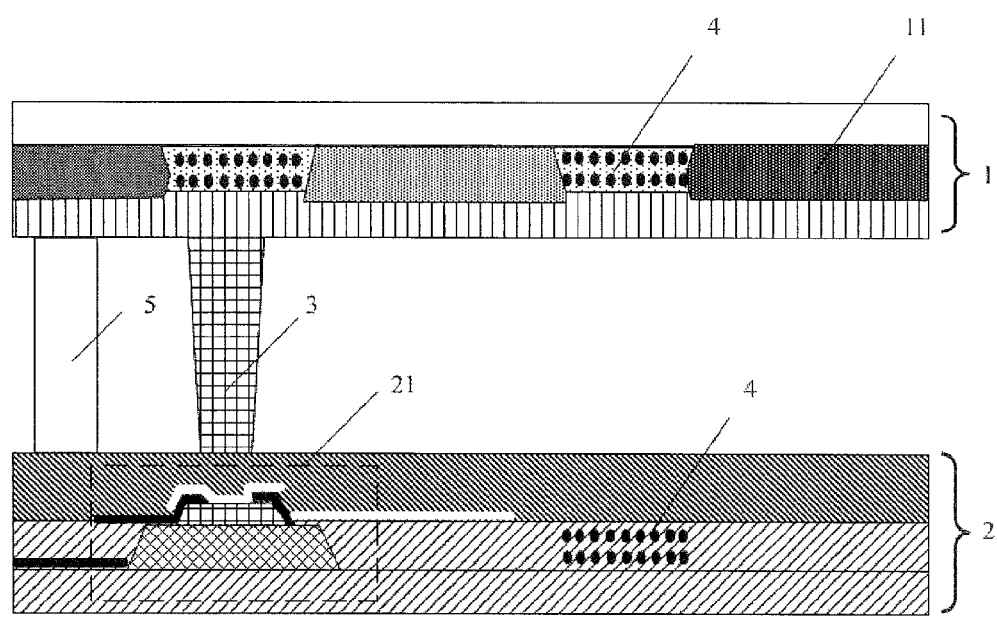
FIG. 4 is a sectional view of the display panel in FIG. 3; wherein the reference numerals are as follows:
1—color filter substrate; 11—color photoresist;
2—array substrate; 21—thin film transistor;
3—spacer;
4—repulsion layer; 41—magnetic particles;
5—sealant.

As shown in FIGS. 3 and 4, in the display panel of this Example, the first substrate is a color filter substrate 1, the second substrate is an array substrate 2, and at least a part of spacing regions of the color filter substrate 1 are further provided with spacers 3. Repulsion layers 4 are provided in both of the color filter substrate 1 and the array substrate 2, respectively. The repulsion layer 4 comprises magnetic particles 41 with the same polarity. By providing magnetic particles 41 in the color filter substrate 1 and the array substrate 2 which are cell-assembled at the top and at the bottom, the display panel of this Example skillfully increases the action force, particularly repulsive force, between the color filter substrate 1 and the array substrate 2 from a different perspective, and thereby its action force may be greatly increased. Furthermore, the uniformity and the stability of the cell thickness are increased in cooperation with the effect of nominal spacing of the spacer 3 on the color filter substrate 1 and the array substrate 2 by using dual effects of the repulsion layer 4 and the spacer 3.

Here, the magnetic particle 41 is formed by doping a magnetic transition metal with a nonmagnetic transition metal. It is favorable to form action forces which repel each other by using magnetic particles 41 with the same polarity so as to exert a supporting effect similar to that of the spacer 3.

Preferably, the doping ratio of the magnetic transition metal to the nonmagnetic transition metal is in a range of 90-60:10-40, more preferably 80-60:20-40, and most preferably 70-65:30-35. Here, the magnetic transition metal comprises iron (Fe) or cobalt (Co) or manganese (Mn), and the nonmagnetic transition metal comprises zinc (Zn) or tin (Ti). The magnetic particles 41 with the same polarity are obtained by formulating a dopant containing a magnetic transition metal element and a dopant containing a nonmagnetic transition metal element at a certain ratio. The constituent components of the magnetic particle 41 herein are substantially commonly-used materials, which are conveniently and easily selected.

In the existing display panel, the color filter substrate 1 and the array substrate 2 are correspondingly divided into a plurality of pixel regions, and spacing regions are formed between the areas of the adjacent pixel regions, and the repulsion layers 4 are at least distributed in the spacing regions of the color filter substrate 1 and the array substrate 2. By only providing the repulsion layers 4 in the spacing regions, a good pixel transmittance of the display panel can be ensured and the displaying effect can be ensured.

Preferably, the magnetic particles 41 are uniformly distributed in the repulsion layer 4, and the repulsion layer 4 has a thickness in a range of 500 Å-2000 Å, more preferably 700 Å-1500 Å, and most preferably 800 Å-1000 Å. the magnetic particles 41 are uniformly distributed in the repulsion layer 4, and a balanced repulsive force can be effectively ensured.

In the display panel of this Example, since there are action forces which repel each other between the color filter substrate and the array substrate, the spacers can be only provided in a part of the spacing regions so as to ensure a cell thickness with a uniform thickness on a basis of maintaining a decreased density of the spacer. That is, as for the distribution of the repulsion layers 4 in the color filter substrate 1 and the array substrate 2, although the repulsion layers 4 of both of them are provided in spacing regions, the magnetic particles 41 are not required to be completely reciprocally distributed. For example, in the display panel shown in FIG. 4, the pattern of the repulsion layer 4 may not be provided in an area in the array substrate 2 which area is provided corresponding to a thin film transistor 21, the magnetic particles 41 in the color filter substrate 1 corresponding to this area will form a slant repulsive force with magnetic particles 41 in other areas in the array substrate 2, and an effective repulsive force can be still ensured.

In the display panel of this Example, the repulsion layer 4 is formed by a patterning process, and a repulsion film layer preliminarily doped with the magnetic particles 41 is formed by deposition in a film-forming process in the patterning process. A separate layer structure formed of magnetic particles with the same polarity may be used as the repulsion film layer herein, and a patterning process wherein the etching process is a dry etching process is used to form a pattern comprising a repulsion layer. Of course, the magnetic particles with the same polarity may also be formed at the same time of forming an insulating film layer of the color filter substrate or the array substrate, and a patterning process is used to form a pattern comprising a repulsion layer. In comparison, the repulsion layer formed by the later method has an adherence better than that of the repulsion layer formed by the former method, and will not be easily peeled off.

The thin film transistor 21 typically comprises layer structures of a gate electrode, a gate electrode insulating layer, an active layer, a source electrode and a drain electrode provided in the same layer or the like. The structures of a passivation layer, a pixel electrode or the like, are typically further provided on the thin film transistor 21. The color filter substrate comprises layer structures of color photoresists, black matrices provided between the adjacent color photoresists, flat layers or the like. Preferably, magnetic particles are provided in the gate electrode insulating layer of the array substrate to form the repulsion layer; and/or magnetic particles are provided in the black matrix of the color filter substrate to form the repulsion layer. By incorporating the function of the repulsion layer into any layer structure of the array substrate and the color filter substrate, the thickness of the display panel will not be additionally increased, and a lighter and thinner structure of the display panel is ensured. Of course, the function of the repulsion layer may not be incorporated into any layer structure of the array substrate and the color filter substrate while a new independent repulsion layer is separately formed in each of the array substrate and the color filter substrate, which is not specifically defined herein.

The thin film transistor in the array substrate may be a top gate type structure or a bottom gate type structure. As shown in FIG. 4, in the display panel of this Example, by exemplifying the array substrate 2 comprising a structure of a bottom gate type thin film transistor, the thin film transistor 21 typically comprises layer structures of a gate electrode, a gate electrode insulating layer, an active layer, a source electrode and a drain electrode provided in the same layer or the like, provided in this order.

In the process of preparation, the same layer structures in the pixel regions of the array substrate and the color filter substrate are formed by using the same patterning process. For example, by exemplifying the black matrix in the color filter substrate 1 while providing the function of the repulsion layer and an independent repulsion layer newly formed on the thin film transistor and under the passivation layer in the array substrate, the methods for preparing the repulsion layers 4 in the color filter substrate 1 and the array substrate 2 are as follows.

In the Color Filter Substrate 1:

The magnetic particles 41 prepared above are doped into a black matrix material used for dividing color areas to obtain a magnetic black matrix material. A black matrix film layer is in turn formed in a manner of deposition by a plasma enhanced chemical vapor deposition (PEVCD) method, a pattern comprising a black matrix is formed by a patterning process, and the preparation of the repulsion layer 4 in the color filter substrate 1 is achieved at the same time. Next, a color photoresist 11 is formed in a pixel region surrounded by the black matrix by using a patterning process again.

In the Array Substrate 2:

On the basis of the formation of the thin film transistor 21, the magnetic particles 41 prepared above are deposited onto the thin film transistor 21 (an insulating layer is preferably provided between the thin film transistor 21 and the repulsion layer 4 in order to prevent the properties of the thin film transistor 21 from being affected) by plasma enhanced chemical vapor deposition (PEVCD) method, and a pattern comprising a repulsion layer 4 is formed in an area corresponding to a spacing region by a patterning process. Next, the structures including a passivation layer, a pattern of a pixel electrode or the like, are formed on the repulsion layer 4 by using a patterning process again.

Furthermore, the color filter substrate 1 and the array substrate 2 are cell-assembled, the cell thickness between the color filter substrate 1 and the array substrate 2 is maintained by the spacers 3, and integration is achieved by a sealant 5.

The patterning process described above may only comprise a photolithographic process, or may comprise a photolithographic process and an etching step, and may further comprise other processes for forming a predetermined pattern such as printing, ink jetting or the like, at the same time. The photolithographic process refers to a process for forming a pattern using a photoresist, a mask plate, a exposure machine or the like, which comprises the process procedures of film forming, exposure, development or the like. A corresponding patterning process may be selected according to the structure formed in this disclosure.

In the display panel of this Example, with respect to the cell thickness of the flexible display panel, repulsion layers are provided in both of a first substrate and a second substrate which are cell-assembled at the top and at the bottom, and one substrate provides an opposite action force to the other by the magnetically repulsive force between both of them to maintain a uniform distance range between the first substrate and the second substrate. This effectively solves the drawback that the flexible display panel is excessively soft, and the effect of effectively maintaining the liquid crystal cell thickness of the flexible display panel has been achieved, which enables the display panel to have a better displaying effect.

Example 2

This Example provides a display panel, which has a uniform liquid crystal cell thickness so as to have a better displaying effect.

The difference between the display panel in this Example and the display panel in Example 1 is that the repulsion layer 4 in the display panel in this Example may be provided in an entire layer. That is, with respect to the display panel in Example 1, the repulsion layer 4 further extends to the pixel regions of the first substrate and the second substrate. At this time, the range of the thickness of the repulsion layer 4 may be suitably less than the thickness of the repulsion layer 4 in Example 1, and preferably the thickness of the repulsion layer 4 is in a range of 500 Å-1000 Å to ensure that the pixel region has a good light transmittance.

For example, the repulsion layer 4 and the passivation layer may be combined, and the function of the repulsion layer is provided to the passivation layer as the same time. Compared to the array substrate of Example 1, the method for preparing the repulsion layer 4 in the array substrate of this Example is as follows. On the basis of the formation of the thin film transistor 21, the magnetic particles 41 prepared above is doped into a passivation layer material for protecting the thin film transistor 21 to obtain a magnetic passivation layer material. A passivation film layer is in turn formed in a manner of deposition by a plasma enhanced chemical vapor deposition method, a pattern comprising a passivation layer is formed by a patterning process, and the preparation of the repulsion layer 4 in the array substrate 2 is achieved at the same time. Next, the structures including a pixel electrode or the like, are formed on the passivation layer by using a patterning process again.

Other structures of the display panel in this Example are the same as corresponding structures of the display panel in Example 1, and detailed descriptions are omitted herein.

By the addition of the repulsion layer to the liquid crystal display panels in Example 1 and Example 2, the effect of maintaining a uniform cell thickness of the flexible display panel is achieved and the display panel is allowed to have a better displaying effect.

Example 3

This Example provides a display apparatus, which comprises any display panel in Example 1 or Example 2.

The display apparatus may be any product or member having the function of display, such as a wearable device, an electronic paper, a cell phone, a tablet computer, a television, a laptop, a digital photo frame, a navigator or the like.

Due to the use of the display panel in Example 1 or Example 2, this display apparatus ensures a uniform thickness of liquid crystal and thus has a better displaying effect.

It can be understood that the above embodiments are merely exemplary embodiments used for illustrating the principle of this disclosure. However, this disclosure is not limited thereto. With respect to those of ordinary skill in the art, various variations and modifications can be made without departing from the spirit and the substance of this disclosure. These variations and modifications are also considered as the scope protected by this disclosure.

What is claimed is:

1. A display panel, comprising a first substrate and a second substrate provided by cell-assembling, wherein the first substrate and the second substrate are both flexible and bendable, and wherein both of the first substrate and the second substrate are provided with a repulsion layer therein, which enables the first substrate and the second substrate to repel each other, wherein the repulsion layer comprises magnetic particles with the same polarity, and the magnetic particles are formed by doping a magnetic transition metal with a nonmagnetic transition metal.

2. The display panel according to claim 1, wherein the doping ratio of the magnetic transition metal to the nonmagnetic transition metal is in a range of 90-60:10-40.

3. The display panel according to claim 1, wherein the magnetic transition metal comprises Fe, Co or Mn, and the nonmagnetic transition metal comprises Zn or Ti.

4. The display panel according to claim 1, wherein the magnetic particles are uniformly distributed in the repulsion layer, and the repulsion layer has a thickness in a range of 500 Å-2000 Å.

5. The display panel according to claim 1, wherein the repulsion layer is formed by a patterning process, and a repulsion film layer preliminarily doped with the magnetic particles is formed by deposition in a film-forming process in the patterning process.

6. The display panel according to claim 1, wherein the first substrate and the second substrate are correspondingly divided into a plurality of pixel regions, and spacing regions are formed between the areas of the adjacent pixel regions, and the repulsion layers are at least distributed in the spacing regions of the first substrate and the second substrate.

7. The display panel according to claim 6, wherein the repulsion layer further extends to the pixel regions of the first substrate and the second substrate.

8. The display panel according to claim 6, wherein the first substrate is a color filter substrate, the second substrate is an array substrate, and at least a part of the spacing regions of the color filter substrate are further provided with a spacer.

9. The display panel according to claim 8, wherein the array substrate comprises a gate electrode insulating layer, and magnetic particles are provided in the gate electrode insulating layer to form the repulsion layer;
and/or, the color filter substrate comprises color photoresists and a black matrix provided between the adjacent color photoresists, and magnetic particles are provided in the black matrix to form the repulsion layer.

10. A display apparatus, comprising the display panel according to claim 1.

11. The display apparatus according to claim 10, wherein the doping ratio of the magnetic transition metal to the nonmagnetic transition metal is in a range of 90-60:10-40.

12. The display apparatus according to claim 10, wherein the magnetic transition metal comprises Fe, Co or Mn, and the nonmagnetic transition metal comprises Zn or Ti.

13. The display apparatus according to claim 10, wherein the magnetic particles are uniformly distributed in the repulsion layer, and the repulsion layer has a thickness in a range of 500 Å-2000 Å.

14. The display apparatus according to claim 10, wherein the repulsion layer is formed by a patterning process, and a repulsion film layer preliminarily doped with the magnetic particles is formed by deposition in a film-forming process in the patterning process.

15. The display apparatus according to claim 10, wherein the first substrate and the second substrate are correspondingly divided into a plurality of pixel regions, and spacing regions are formed between the areas of the adjacent pixel regions, and the repulsion layers are at least distributed in the spacing regions of the first substrate and the second substrate.

16. The display apparatus according to claim 15, wherein the repulsion layer further extends to the pixel regions of the first substrate and the second substrate.

17. The display apparatus according to claim 15, wherein the first substrate is a color filter substrate, the second substrate is an array substrate, and at least a part of the spacing regions of the color filter substrate are further provided with a spacer.

18. The display apparatus according to claim 17, wherein the array substrate comprises a gate electrode insulating layer, and magnetic particles are provided in the gate electrode insulating layer to form the repulsion layer;
and/or, the color filter substrate comprises color photoresists and a black matrix provided between the adjacent color photoresists, and magnetic particles are provided in the black matrix to form the repulsion layer.

* * * * *